United States Patent
Kim

(10) Patent No.: US 10,742,198 B2
(45) Date of Patent: Aug. 11, 2020

(54) PIPE LATCH, SEMICONDUCTOR APPARATUS AND SEMICONDUCTOR SYSTEM USING THE PIPE LATCH

(71) Applicant: SK hynix Inc., Icheon-si Gyeonggi-do (KR)

(72) Inventor: Hyun Seung Kim, Icheon-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/184,732

(22) Filed: Nov. 8, 2018

(65) Prior Publication Data

US 2019/0326888 A1 Oct. 24, 2019

(30) Foreign Application Priority Data

Apr. 23, 2018 (KR) .................. 10-2018-0046539

(51) Int. Cl.
*H03K 3/012* (2006.01)
*H03K 3/037* (2006.01)

(52) U.S. Cl.
CPC ............. *H03K 3/012* (2013.01); *H03K 3/037* (2013.01)

(58) Field of Classification Search
USPC ................ 327/208, 210, 212, 213, 214, 218
See application file for complete search history.

(56) References Cited

U.S. PATENT DOCUMENTS

| | | | | |
|---|---|---|---|---|
| 4,658,354 A | * | 4/1987 | Nukiyama | G06F 11/2236 714/30 |
| 5,926,487 A | * | 7/1999 | Chappell | G01R 31/31853 327/202 |
| 6,005,825 A | * | 12/1999 | Lee | G11C 7/1039 365/233.12 |
| 6,278,308 B1 | * | 8/2001 | Partovi | H03K 3/012 327/200 |
| 6,329,942 B1 | * | 12/2001 | Nagaraj | H03M 1/004 341/158 |
| 6,417,711 B2 | * | 7/2002 | Fulkerson | H03K 3/012 327/203 |
| 6,424,194 B1 | * | 7/2002 | Hairapetian | H03K 17/04106 327/210 |
| 7,117,412 B2 | * | 10/2006 | Ogawa | H03K 3/012 714/724 |
| 7,183,825 B2 | * | 2/2007 | Padhye | G11C 5/147 327/202 |
| 7,768,331 B1 | * | 8/2010 | Biyani | H03K 3/0375 327/199 |

(Continued)

FOREIGN PATENT DOCUMENTS

KR 1020160041535 A 4/2016

*Primary Examiner* — Adam D Houston
(74) *Attorney, Agent, or Firm* — William Park & Associates Ltd.

(57) ABSTRACT

A semiconductor apparatus including a pipe latch is provided. The pipe latch includes a first latch unit, a second latch unit and an output unit. The first latch unit configured to store an input signal into a first latch node based on a first input control signal. The second latch unit configured to store the signal stored in the first latch node into a second latch node based on a second input control signal. The output unit configured to output the signal stored in the second latch node as output signal based on an output control signal.

19 Claims, 6 Drawing Sheets

(56) References Cited

U.S. PATENT DOCUMENTS

| | | | | |
|---|---|---|---|---|
| 8,559,258 B1* | 10/2013 | Stephens, Jr. | G11C 7/22 | 365/222 |
| 8,817,520 B2* | 8/2014 | Khanna | G11C 11/221 | 365/145 |
| 9,230,000 B1* | 1/2016 | Hsieh | G06F 16/2379 | |
| 9,287,858 B1* | 3/2016 | Singhal | H03K 3/012 | |
| 9,692,418 B1* | 6/2017 | Lewis | H03K 19/017581 | |
| 10,402,202 B2* | 9/2019 | Hong | G11C 7/106 | |
| 2003/0097541 A1* | 5/2003 | Abrosimov | G06F 15/8053 | 712/1 |
| 2004/0008055 A1* | 1/2004 | Khanna | H03K 19/17784 | 326/40 |
| 2004/0032290 A1* | 2/2004 | Lundberg | H03K 3/012 | 327/202 |
| 2004/0046590 A1* | 3/2004 | Singh | G06F 9/3871 | 326/93 |
| 2006/0103367 A1* | 5/2006 | Boerstler | G06F 1/06 | 324/76.47 |
| 2006/0133158 A1* | 6/2006 | Shin | G11C 7/106 | 365/189.05 |
| 2008/0218235 A1* | 9/2008 | Sekine | H03K 3/35625 | 327/212 |
| 2009/0027097 A1* | 1/2009 | Kanno | G11C 5/063 | 327/208 |
| 2009/0108896 A1* | 4/2009 | Yasuda | H03K 3/0375 | 327/202 |
| 2009/0115481 A1* | 5/2009 | Kim | G01R 31/318594 | 327/198 |
| 2009/0237136 A1* | 9/2009 | Kim | H03K 3/356104 | 327/210 |
| 2010/0019814 A1* | 1/2010 | Park | G11C 7/1051 | 327/162 |
| 2010/0142308 A1* | 6/2010 | Kim | G11C 7/1018 | 365/233.13 |
| 2010/0244918 A1* | 9/2010 | Moyer | H03K 19/0075 | 327/208 |
| 2011/0095800 A1* | 4/2011 | Ramaraju | H03K 3/356173 | 327/211 |
| 2011/0243147 A1* | 10/2011 | Paul | H04L 45/60 | 370/401 |
| 2012/0033511 A1* | 2/2012 | Kim | G11C 7/1069 | 365/189.15 |
| 2013/0021076 A1* | 1/2013 | Kuenemund | H03K 3/356008 | 327/202 |
| 2013/0057329 A1* | 3/2013 | Tiwari | G01R 31/318541 | 327/203 |
| 2013/0135017 A1* | 5/2013 | Jones | H03K 3/356173 | 327/142 |
| 2013/0154708 A1* | 6/2013 | Zhang | H03K 3/356156 | 327/202 |
| 2014/0077843 A1* | 3/2014 | Kennedy | H03L 7/193 | 327/105 |
| 2015/0049045 A1* | 2/2015 | Yousefpor | G02F 1/13452 | 345/174 |
| 2015/0091627 A1* | 4/2015 | Sharma | H03K 3/0375 | 327/218 |
| 2015/0134870 A1* | 5/2015 | Galloway | G06F 1/10 | 710/306 |
| 2015/0207494 A1* | 7/2015 | Kim | H03K 3/356104 | 327/218 |
| 2015/0213846 A1* | 7/2015 | Nakagawa | G11C 11/24 | 365/72 |
| 2015/0236676 A1* | 8/2015 | Cai | H03K 3/356 | 327/212 |
| 2015/0358004 A1* | 12/2015 | Shirai | H03K 21/00 | 327/115 |
| 2016/0065188 A1* | 3/2016 | Singhal | H03K 3/35625 | 327/203 |
| 2016/0065190 A1* | 3/2016 | Paul | H03K 3/012 | 327/203 |
| 2016/0254803 A1* | 9/2016 | Kanno | H03K 19/17724 | 327/203 |
| 2016/0308541 A1* | 10/2016 | Liu | H03L 7/089 | |
| 2018/0076835 A1* | 3/2018 | Ray | G01S 7/021 | |
| 2018/0082720 A1* | 3/2018 | Richard | G06F 13/4022 | |
| 2018/0165098 A1* | 6/2018 | Hong | G11C 7/222 | |

* cited by examiner

PIPE LATCH, SEMICONDUCTOR APPARATUS AND SEMICONDUCTOR SYSTEM USING THE PIPE LATCH

CROSS-REFERENCES TO RELATED APPLICATION

The present application claims priority under 35 U.S.C. § 119(a) to Korean application number 10-2018-0046539, filed on Apr. 23, 2018, in the Korean Intellectual Property Office, which is incorporated herein by reference in its entirety as set forth in full.

BACKGROUND

1. Technical Field

Various embodiments of the present disclosure generally relate to an integrated circuit technology and, more particularly, to a semiconductor apparatus and a semiconductor system using the semiconductor apparatus.

2. Related Art

An electronic device includes a lot of electronic elements, and a computer system includes lots of semiconductor apparatuses comprising a semiconductor. Semiconductor apparatuses included in a computer system communicate with one another in synchronization with a clock signal. The semiconductor apparatuses may include pipe circuits configured to perform pipelining operations for efficient process of a great deal of information therein. The respective pipe circuits may include a plurality of pipe latches for the pipelining operations.

Nowadays, there is a growing tendency in the R&D field of computer systems and semiconductor apparatuses to focus on high speed and low power consumption. As operating speeds of computer systems increase, frequencies of clock signals become higher. As the frequencies of clock signals become higher, latencies of semiconductor apparatuses increase. As the latencies of semiconductor apparatuses increase, the semiconductor apparatuses have a greater burden to perform the pipelining operations for a greater deal of information. The burden may be alleviated through a greater number of pipe latches in the pipe circuits. However, a size increase in circuits due to the greater number of pipe latches conflicts with the tendency of reducing the circuit size. It is required for a circuit to efficiently perform a pipelining operation without having increased size of the circuit.

SUMMARY

In an embodiment of the present disclosure, a semiconductor apparatus may include a pipe latch, wherein the pipe latch includes: a first latch unit configured to store input signal into a first latch node based on a first input control signal; a second latch unit configured to store the signal stored in the first latch node into a second latch node based on a second input control signal; and an output unit configured to output the signal stored in the second latch node as output signals based on an output control signal.

In an embodiment of the present disclosure, a semiconductor apparatus may include a pipe circuit, wherein the pipe circuit includes: a pipe control signal generation circuit configured to generate a first input control signal and an output control signal based on a command signal and a clock signal, and configured to generate a second input control signal based on the first input control signal and the output control signal; and at least two pipe latches configured to store input signals to output output signals based on the first input control signal, the second input control signal and the output control signal, and configured to store at least two input signals.

In an embodiment of the present disclosure, a semiconductor apparatus may include first to m-th pipe latches configured to sequentially store a signal of an assigned turn among n numbers of input signals and generate output signals, wherein n is an integer equal to or greater than 3 and m is an integer between 2 and n, wherein the first pipe latch receives and stores a first signal of the input signals; stores, when an (m+1)th signal among the input signals is input before the first signal is output as the output signal, the first signal and the (m+1)th signal together; and sequentially outputs the first signal and the (m+1)th signal.

BRIEF DESCRIPTION OF THE DRAWINGS

Features, aspects and embodiments are described in conjunction with the attached drawings, in which.

DETAILED DESCRIPTION

Hereinafter, a semiconductor apparatus according to the present disclosure will be described below with reference to the accompanying drawings through various embodiments.

Figure 1:
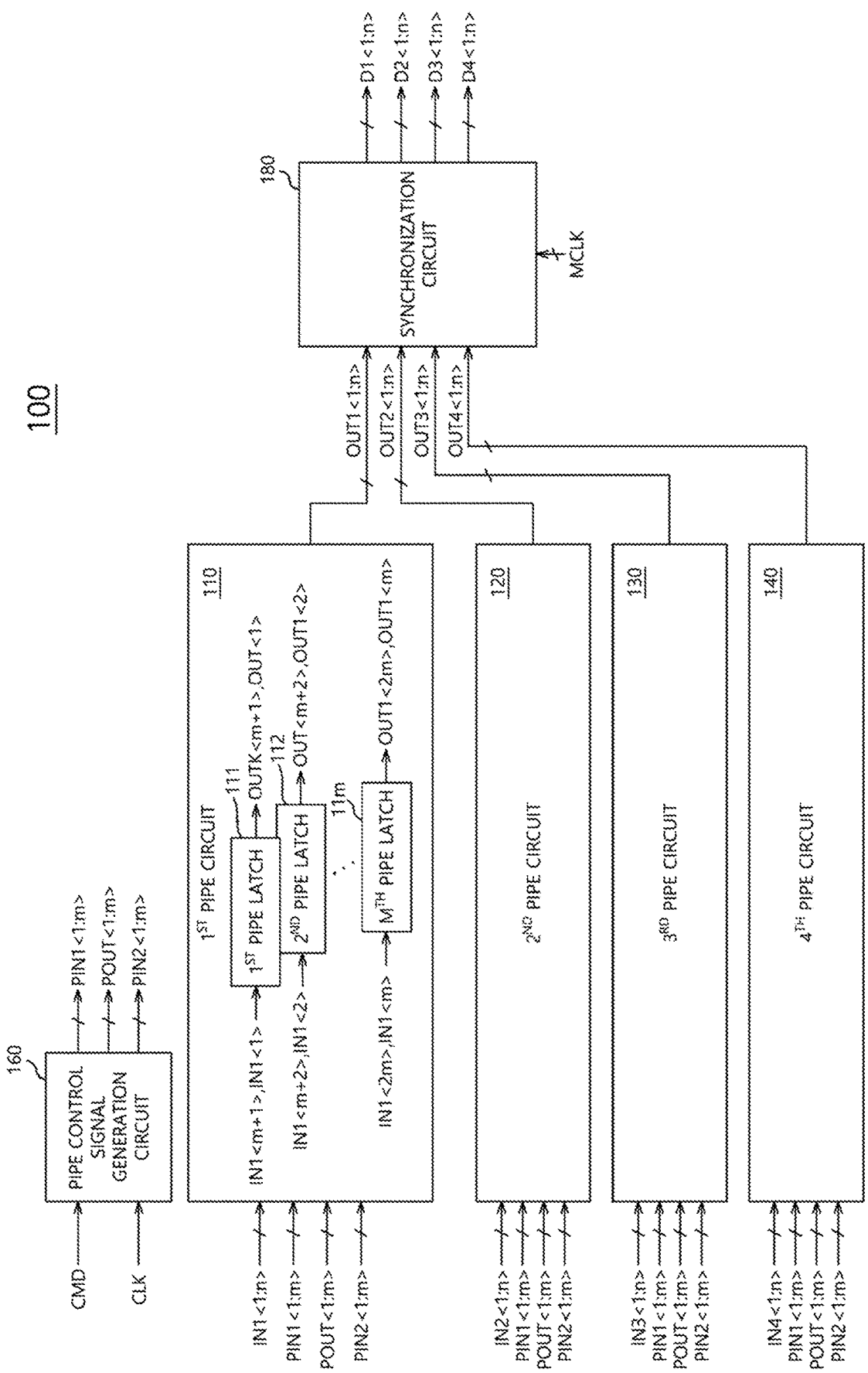
FIG. 1 is a diagram illustrating a representation of an example of a configuration of a semiconductor apparatus in accordance with an embodiment of the present disclosure.

FIG. 1 is a diagram illustrating a representation of an example of a configuration of a semiconductor apparatus 100 in accordance with an embodiment of the present disclosure. Referring to FIG. 1, the semiconductor apparatus 100 may receive an input signal and may generate an output signal. The semiconductor apparatus 100 may perform a pipelining operation and/or a pipe latch operation for efficient process of a plurality of pieces of information. The semiconductor apparatus 100 may include a pipe circuit including at least two pipe latches for a pipelining operation to the input signal. The input signal may include any information required for a pipelining operation. For example, the input signal may be a data signal or a command signal. As illustrated in FIG. 1, the semiconductor apparatus 100 may include a first pipe circuit 110, a second pipe circuit 120, a third pipe circuit 130 and a fourth pipe circuit 140. Even though the semiconductor apparatus 100 is exemplified to include four pipe circuits, the semiconductor apparatus 100 may include any number of pipe circuits more than a single pipe circuit. The first pipe circuit 110 may receive first input signals IN1<1:$n$> and may output first output signals OUT1<1:$n$>. The first pipe circuit 110 may output the first output signals OUT1<1:$n$> by performing a pipelining operation to the first input signals IN1<1:$n$>. The second pipe circuit 120 may receive second input signals IN2<1:$n$> and may output second output signals OUT2<1:$n$>. The second pipe circuit 120 may output the second output signals OUT2<1:$n$> by performing a pipelining operation to the second input signals IN2<1:$n$>. The third pipe circuit 130 may receive third input signals IN3<1:$n$> and may output third output signals OUT3<1:$n$>. The third pipe circuit 130 may output the third output signals OUT3<1:$n$> by performing a pipelining operation to the third input signals IN3<1:$n$>. The fourth pipe circuit 140 may receive fourth input signals IN4<1:$n$> and may output fourth output signals OUT4<1:$n$>. The fourth pipe circuit 140 may output the fourth output signals OUT4<1:$n$> by performing a pipelining operation to the fourth input signals IN4<1:$n$>. The first to fourth input signals IN1<1:$n$>, IN2<1:$n$>, IN3<1:$n$> and IN4<1:$n$> may be a signal stream including a plurality of signals. For example, the signal stream may be a data stream. The first to fourth pipe circuits 110, 120, 130 and 140 may sequentially store the first to fourth input signals IN1<1:$n$>, IN2<1:$n$>, IN3<1:$n$> and IN4<1:$n$> and may sequentially output the stored signals as the first to fourth output signals OUT1<1:$n$>, OUT2<1:$n$>, OUT3<1:$n$> and OUT4<1:$n$>, respectively.

The first to fourth pipe circuits 110, 120, 130 and 140 may commonly receive first input control signals PIN1<1:$m$>, output control signals POUT<1:$m$> and second input control signals PIN2<1:$m$>. The first pipe circuit 110 may sequentially store the first input signals IN1<1:$n$> and may generate the first output signals OUT1<1:$n$>, based on the first input control signals PIN1<1:$m$>, the output control signals POUT<1:$m$> and the second input control signals PIN2<1:$m$>. The second pipe circuit 120 may sequentially store the second input signals IN2<1:$n$> and may generate the second output signals OUT2<1:$n$>, based on the first input control signals PIN1<1:$m$>, the output control signals POUT<1:$m$> and the second input control signals PIN2<1:$m$>. The third pipe circuit 130 may sequentially store the third input signals IN3<1:$n$> and may generate the third output signals OUT3<1:$n$>, based on the first input control signals PIN1<1:$m$>, the output control signals POUT<1:$m$> and the second input control signals PIN2<1:$m$>. The fourth pipe circuit 140 may sequentially store the fourth input signals IN4<1:$n$> and may generate the fourth output signals OUT4<1:$n$>, based on the first input control signals PIN1<1:$m$>, the output control signals POUT<1:$m$> and the second input control signals PIN2<1:$m$>. The first to fourth pipe circuits 110, 120, 130 and 140 may have the same configuration as one another.

Referring to FIG. 1, the first pipe circuit 110 will be representatively described. The first pipe circuit 110 may include a plurality of pipe latches and may include at least a single pipe latch. Referring to FIG. 1, for example, the first pipe circuit 110 including first to m-th pipe latches 111, 112 and 11$m$ ('m' is an integer equal to or greater than 3). The first input signals IN1<1:$n$> may include 'n' numbers of signals ('n' is an integer equal to or greater than 'm'). Each of the first input control signals PIN1<1:$m$>, the output control signals POUT<1:$m$> and the second input control signals PIN2<1:$m$> may include 'm' numbers of signals. Each of the first to m-th pipe latches 111, 112 and 11$m$ may receive a signal of an assigned turn among the first input signals IN1<1:$n$>. The first pipe latch 111 may receive one or more between a first input signal IN1<1> and an (m+1)-th input signal IN1<$m$+1>. When 'n' is great enough, the first pipe latch 111 may receive a (2$m$+1)-th input signal IN1<2$m$+1>, a (3$m$+1)-th input signal IN1<3$m$+1> and so forth. The second pipe latch 112 may receive one or more between a second input signal IN1<2> and an (m+2)-th input signal IN1<$m$+2>. When 'n' is great enough, the second pipe latch 112 may receive a (2$m$+2)-th input signal IN1<2$m$+2>, a (3$m$+2)-th input signal IN1<3$m$+2> and so forth. The m-th pipe latch 11$m$ may receive one or more between a m-th input signal IN1<$m$> and a 2$m$-th input signal IN1<2$m$>. When 'n' is great enough, the m-th pipe latch 11$m$ may receive a 3$m$-th input signal IN1<3$m$>, a 4$m$-th input signal IN1<4$m$> and so forth. Each of the first to m-th pipe latches 111, 112 and 11$m$ may receive an assigned control signal among the first input control signals PIN1<1:$m$>, the output control signals POUT<1:$m$> and the second input control signals PIN2<1:$m$>. The first pipe circuit 110 may perform an operation based on a first signal PIN1<1> among the first input control signals PIN1<1:$m$>, a first signal PIN2<1> among the second input control signals PIN2<1:$m$> and a first signal POUT<1>0 among the output control signals POUT<1:$m$>. The second pipe circuit 112 may perform an operation based on a second signal PIN1<2> among the first input control signals PIN1<1:$m$>, a second signal PIN2<2> among the second input control signals PIN2<1:$m$> and a second signal POUT<2> among the output control signals POUT<1:$m$>. The m-th pipe circuit 11$m$ may perform an operation based on a m-th signal PIN1<$m$> among the first input control signals PIN1<1:$m$>, a m-th signal PIN2<$m$> among the second input control signals PIN2<1:$m$> and a m-th signal POUT<m> among the output control signals POUT<1:$m$>.

Each of the first to m-th pipe latches 111, 112 and 11$m$ may generate the first output signals OUT1<1:$n$> by storing at least two signals among the first input signals IN1<1:$n$> input at different time points based on the first input control signals PIN1<1:$m$>, the output control signals POUT<1:$m$> and the second input control signals PIN2<1:$m$>. Representatively, the first pipe latch 111 will be described as follows. The first pipe latch 111 may receive and store the first signal IN1<1> among the first input signals IN1<1:$n$>. The first pipe latch 111 may store, when the (m+1)-th signal IN1<$m$+1> is input before the first signal IN1<1> is output, the first signal IN1<1> and the (m+1)-th signal IN1<$m$+1> together. The first pipe latch 111 may sequentially output the first signal IN1<1> and the (m+1)-th signal IN1<$m$+1>, which are sequentially stored therein, as the output signal OUT1<1> and the output signal OUT1<$m$+1>. The first pipe latch 111 might not receive the (2$m$+1)-th signal IN1<2$m$+1> until the stored first signal IN1<1> is output. The second pipe latch 112 and the m-th pipe latch 11$m$ may also perform substantially the same operation as the first pipe latch 111 described above.

The semiconductor apparatus 100 may further include a pipe control signal generation circuit 160. The pipe control signal generation circuit 160 may receive a command signal CMD and a clock signal CLK and may generate the first input control signals PIN1<1:$m$>, the second input control signals PIN2<1:$m$> and the output control signals POUT<1:$m$>. The pipe control signal generation circuit 160 may generate the first input control signals PIN1<1:$m$> and the output control signals POUT<1:$m$> based on the command signal CMD and the clock signal CLK and may generate the second input control signals PIN2<1:$m$> based on the first input control signals PIN1<1:*m*> and the output control signals POUT<1:*m*>. The pipe control signal generation circuit 160 may enable, when the first input control signals PIN1<1:*m*> is firstly enabled, corresponding second input control signals PIN2<1:*m*> together. The pipe control signal generation circuit 160 might not enable, even when the first input control signals PIN1<1:*m*> is secondly enabled, the second input control signals PIN2<1:*m*> according to the first input control signals PIN1<1:*m*>. In this case, the pipe control signal generation circuit 160 may enable, after the output control signals POUT<1:*m*> are enabled, the second input control signals PIN2<1:*m*>. That is, the pipe control signal generation circuit 160 may prevent, when the first input control signals PIN1<1:*m*> are secondly enabled, the second input control signals PIN2<1:*m*> from being enabled until the output control signals POUT<1:*m*> are enabled. Descriptions about the first to m-th pipe latches 111, 112 and 11*m* and the pipe control signal generation circuit 160 will be made later with reference to FIGS. 2 to 4.

Referring to FIG. 1, the semiconductor apparatus 100 may further include a synchronization circuit 180. The synchronization circuit 180 may receive the first to fourth output signals OUT1<1:*n*>, OUT2<1:*n*>, OUT3<1:*n*> and OUT4<1:*n*> output from the first to fourth pipe circuits 110, 120, 130 and 140. The synchronization circuit 180 may receive multi-phase clock signals MCLK. The multi-phase clock signals MCLK may include a plurality of clock signals each having different phases from one another. The synchronization circuit 180 may output the first to fourth output signals OUT1<1:*n*>, OUT2<1:*n*>, OUT3<1:*n*> and OUT4<1:*n*> as final output signals D1<1:*n*>, D2<1:*n*>, D3<1:*n*> and D4<1:*n*> in synchronization with the multi-phase clock signals MCLK, respectively.

Figure 2:
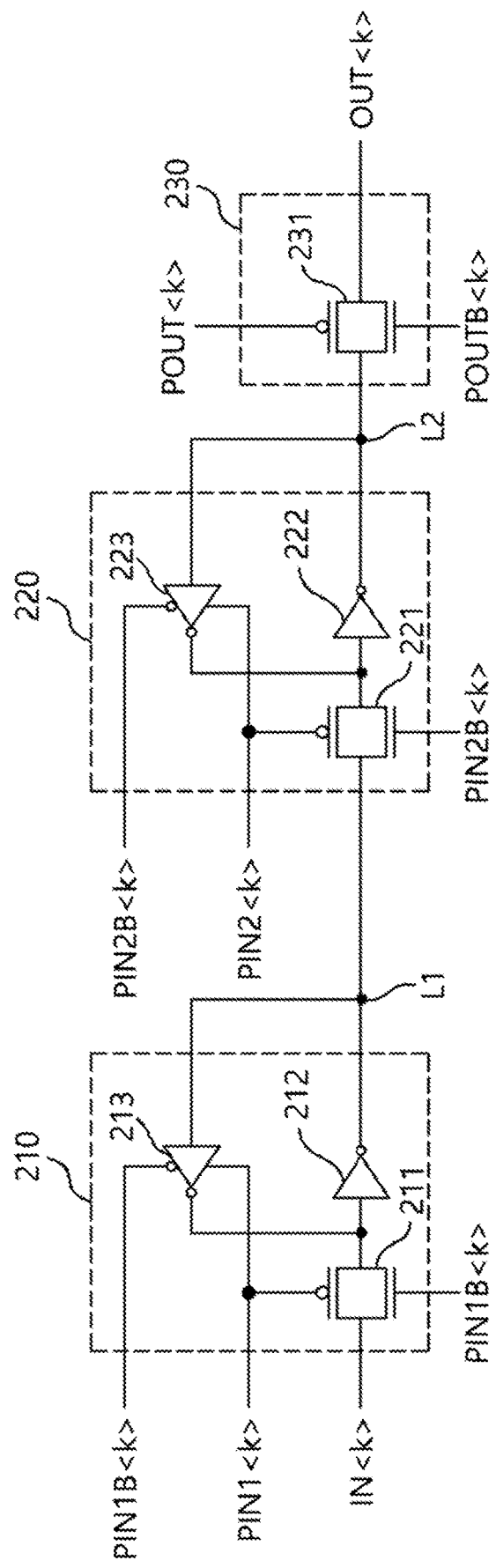
FIG. 2 is a diagram illustrating a representation of an example of a configuration of a pipe latch in accordance with an embodiment of the present disclosure.

FIG. 2 is a diagram illustrating a representation of an example of a configuration of a pipe latch 200 in accordance with an embodiment of the present disclosure. The pipe latch 200 illustrated in FIG. 2 may be applied to each of the first to m-th pipe latches 111, 112 and 11*m* described with reference to FIG. 1. The input signal IN<k> may correspond to, for example, any one of the input signals represented by IN1<1:*n*> to IN4<1:*n*> for a corresponding pipe circuit 110 to 140, etc. Referring to FIG. 2, the pipe latch 200 may store the kth first input signal IN1<k> in a first latch node L1 based on any one of the first input control signals PIN1<1:*m*>, for example, the kth first input control signal PIN1<k>. The pipe latch 200 may store the kth input signal IN1<k> stored in the first latch node L1 in a second latch node L2 based on any one of the second input control signals PIN2<1:*m*>, for example, the kth second input control signal PIN2<k>. The pipe latch 200 may output the kth first input signal IN1<k> stored in the second latch node L2 as the output signal OUT<k> based on any one of the output control signals POUT<1:*m*>, for example, the kth output control signal POUT<k>. The output signal OUT<k> may correspond to, for example, any one of the output signals represented by OUT1<1:*n*> to OUT4<1:*n*> for a corresponding pipe circuit 110 to 140. The pipe latch 200 may include a first latch unit 210, a second latch unit 220 and an output unit 230. The first latch unit 210 may receive the input signal IN<k> ('k' is an integer equal to or greater than 1 and equal to or less than 'm') and may store the input signal IN<k> in the first latch node L1 based on, for example, the kth first input control signal PIN1<k> and the kth complementary first input control signal PIN1B<k>. The reference PIN1B<1:*m*> represents the complementary first input control signals of corresponding first input control signals PIN1<1:*m*>, respectively. The reference PIN2B<1:*m*> represent the complementary second input control signals of corresponding second input control signals PIN2<1:*m*>, respectively. The first latch unit 210 may store a signal corresponding to the input signal IN<k> in the first latch node L1. For example, the first latch unit 210 may invert the input signal IN<k> and store the inverted signal in the first latch node L1. The second latch unit 220 may be coupled between the first latch node L1 and a second latch node L2. The second latch unit 220 may store the signal stored in the first latch node L1 in the second latch node L2 based on, for example, the kth second input control signal PIN2<k> and the kth complementary second input control PIN2B<k>. The second latch unit 220 may store a signal corresponding to the signal stored in the first latch node L1 in the second latch node L2. For example, the second latch unit 220 may invert the signal stored in the first latch node L1 and may store the inverted signal in the second latch node L2. The output unit 230 may be coupled to the second latch node L2 and may generate the output signal OUT<k>. The output unit 230 may output the signal stored in the second latch node L2 as the output signal OUT<k> based on any one of the output control signals POUT<1:*m*>, for example, the Kth output control signal POUT<k> and the kth complementary output control signal POUTB<k>. The reference POUTB<1:*m*> represents the complementary output control signals of corresponding output control signals POUT<1:*m*>, respectively.

Referring to FIG. 2, the first latch unit 210 may include a first pass gate 211, a first inverter 212 and a second inverter 213. In an embodiment, the first pass gate 211 may receive the input signal IN<k>. The first pass gate 211 may receive the kth first input control signal PIN1<k> at its P-channel node and may receive a kth complementary first input control signal signal PIN1B<k> of the kth first input control signal PIN1<k> at its N-channel node. The kth first input control signal PIN1<k> may be a low-enabled signal. When the kth first input control signal PIN1<k> is enabled to a low level, the first pass gate 211 may be turned on and may transfer the input signal IN<k>. The first inverter 212 may receive the output of the first pass gate 211. The first inverter 212 may inversion-drive the output of the first pass gate 211 and may output the inverted signal to the first latch node L1. The second inverter 213 may receive the kth first input control signal PIN1<k> and the kth complementary first input control signal PIN1B<k> of the kth first input control signal PIN1<k>. An input node of the second inverter 213 may be coupled to an output node of the first inverter 212 and an output node of the second inverter 213 may be coupled to an input node of the first inverter 212. The second inverter 213 may latch and/or keep the voltage level of the first latch node L1 by forming a latch with the first inverter 212 when the kth first input control signal PIN1<k> is enabled. The first inverter 212 and the second inverter 213 may invert the input signal IN<k> and store the inverted signal in the first latch node L1.

The second latch unit 220 may include a second pass gate 221, a third inverter 222 and a fourth inverter 223. The second pass gate 221 may be coupled to the second latch node L2. The second pass gate 221 may receive the kth second input control signal PIN2<k> at its P-channel node and may receive a kth complementary second input control signal PIN2B<k> of the kth second input control signal PIN2<k> at its N-channel node. The kth second input control signal PIN2<k> may be a low-enabled signal. When the kth second input control signal PIN2<k> is enabled to a low level, the second pass gate 221 may be turned on and may transfer the signal stored in the first latch node L1. The third inverter 222 may receive the output of the second pass gate 221. The third inverter 222 may inversion-drive the output of the second pass gate 221 and may output the inverted signal to the second latch node L2. The fourth inverter 223 may receive the kth second input control signal PIN2<k> and the kth complementary second input control signal PIN2B<k> of the kth second input control signal PIN2<k>. An input node of the fourth inverter 223 may be coupled to an output node of the third inverter 222 and an output node of the fourth inverter 223 may be coupled to an input node of the third inverter 222. The fourth inverter 223 may latch and/or keep the voltage level of the second latch node L2 by forming a latch with the third inverter 222 when the kth second input control signal PIN2<k> is enabled. The third inverter 222 and the fourth inverter 223 may invert the signal stored in the first latch node L1 and store the inverted signal in the second latch node L2. Therefore, the signal stored in the second latch node L2 may have a level corresponding to the input signal IN<k>.

The output unit 230 may include a third pass gate 231. The third pass gate 231 may be coupled to the second latch node L2. The third pass gate 231 may receive the kth output control signal POUT<k> at its P-channel node and may receive a kth complementary output control signal POUTB<k> of the kth output control signal POUT<k> at its N-channel node. The kth output control signal POUT<k> may be a low-enabled signal. When the kth output control signal POUT<k> is enabled to a low level, the third pass gate 231 may be turned on and may output the signal stored in the second latch node L2 as the output signal OUT<k>.

Figure 3:
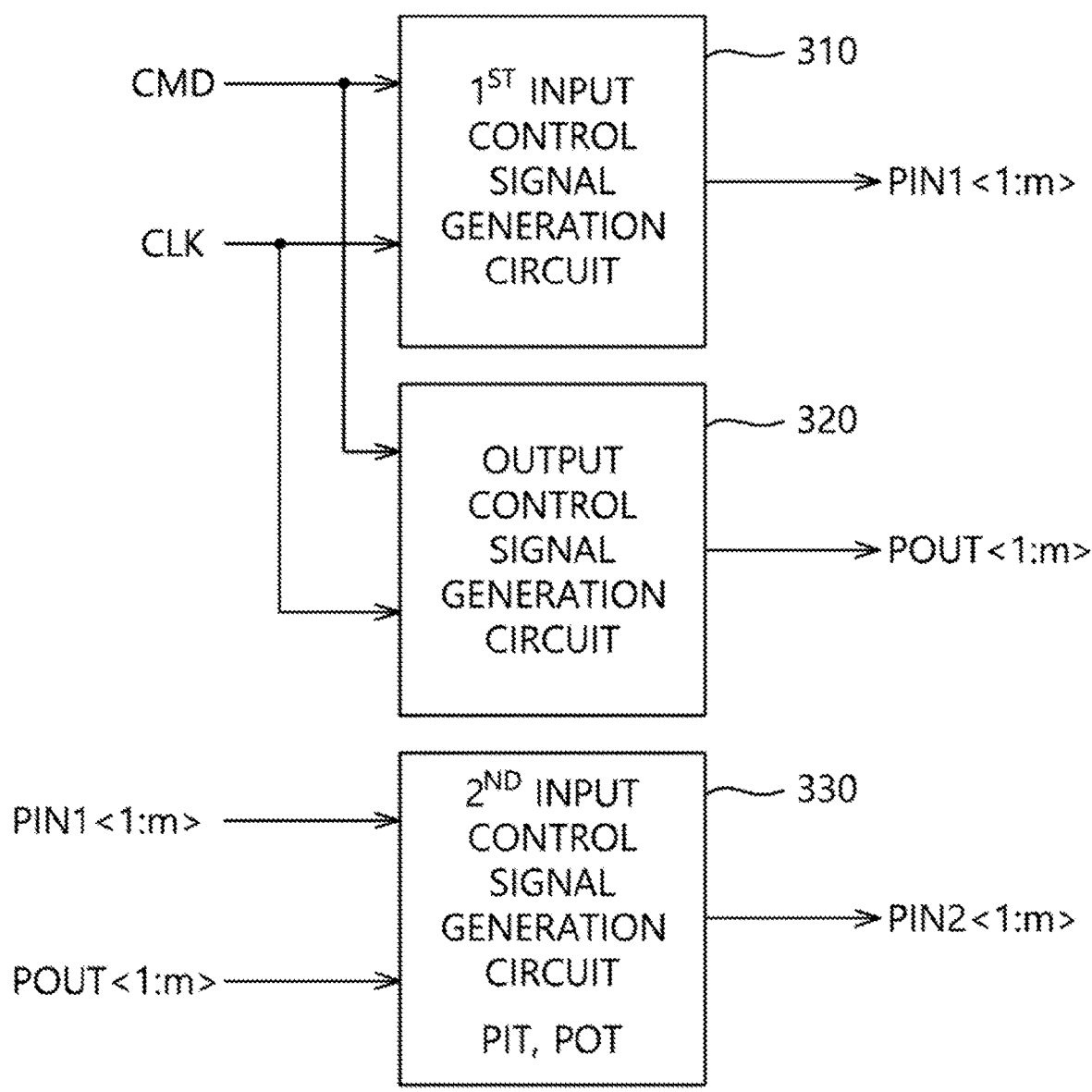
FIG. 3 is a diagram illustrating a representation of an example of a configuration of a pipe control signal generation circuit illustrated in FIG. 1.

FIG. 3 is a diagram illustrating a representation of an example of a configuration of the pipe control signal generation circuit 160 illustrated in FIG. 1. Referring to FIG. 3, the pipe control signal generation circuit 160 may include a first input control signal generation circuit 310, an output control signal generation circuit 320 and a second input control signal generation circuit 330. The first input control signal generation circuit 310 may receive the command signal CMD and the clock signal CLK and may generate the first input control signals PIN1<1:$m$>. The first input control signal generation circuit 310 may sequentially enable the first input control signals PIN1<1:$m$> a first predetermined time duration after the first input control signal generation circuit 310 receives the command signal CMD. For example, the first predetermined time duration may be counted through the clock signal CLK. The first input control signals PIN1<1:$m$> may be sequentially enabled at each period of the clock signal CLK. The output control signal generation circuit 320 may sequentially enable the output control signals POUT<1:$m$> a second predetermined time duration after the first input control signal generation circuit 310 receives the command signal CMD. The second predetermined time duration may be longer than the first predetermined time duration. The pulse widths of the output control signals POUT<1:$m$> may be narrower than the pulse widths of the first input control signals PIN1<1:$m$> and may be wider than the pulse widths of the first input control signals PIN1<1:$m$>. The first input control signal generation circuit 310 and the output control signal generation circuit 320 may be implemented with hardware, software, or any combination thereof configured to generate a pipe input control signal and hardware, software, or any combination thereof configured to generate a pipe output control signal, respectively.

The second input control signal generation circuit 330 may to generate the second input control signals PIN2<1:$m$> based on the first input control signals PIN1<1:$m$> and the output control signals POUT<1:$m$>. The second input control signal generation circuit 330 may generate a first level signal PIT based on the first input control signals PIN1<1:$m$> and may generate a second level signal POT based on the output control signals POUT<1:$m$>. The second input control signal generation circuit 330 may change the logic level of the first level signal PIT whenever the first input control signals PIN1<1:$m$> are enabled. The second input control signal generation circuit 330 may change the logic level of the second level signal POT whenever the output control signals POUT<1:$m$> are enabled. The second input control signal generation circuit 330 may enable the second input control signals PIN2<1:$m$> based on the first and second level signals PIT and POT and one between the first input control signals PIN1<1:$m$> and the output control signals POUT<1:$m$>. For example, the second input control signal generation circuit 330 may enable the second input control signals PIN2<1:$m$> when the logic levels of the first and second level signals PIT and POT are the same as each other and the first input control signals PIN1<1:$m$> are enabled. The second input control signal generation circuit 330 might not enable the second input control signals PIN2<1:$m$> even if the first input control signals PIN1<1:$m$> are enabled when the logic levels of the first and second level signals PIT and POT are not the same as each other. The second input control signal generation circuit 330 may enable the second input control signals PIN2<1:$m$> based on the output control signals POUT<1:$m$> when the logic levels of the first and second level signals PIT and POT are the same as each other.

Figure 4:
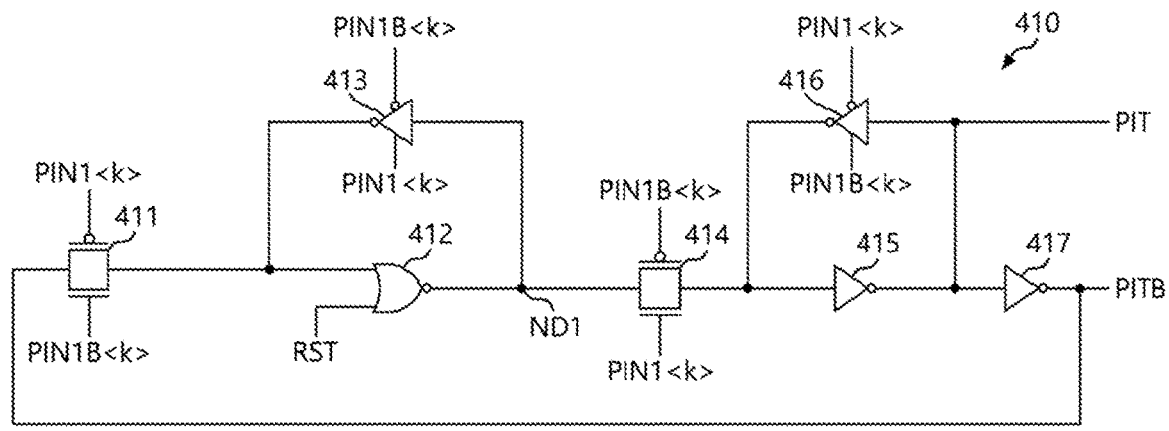
FIG. 4 is a diagram illustrating a representation of an example of a configuration of a second input control signal generation circuit in accordance with an embodiment of the present disclosure.
Figure 4:
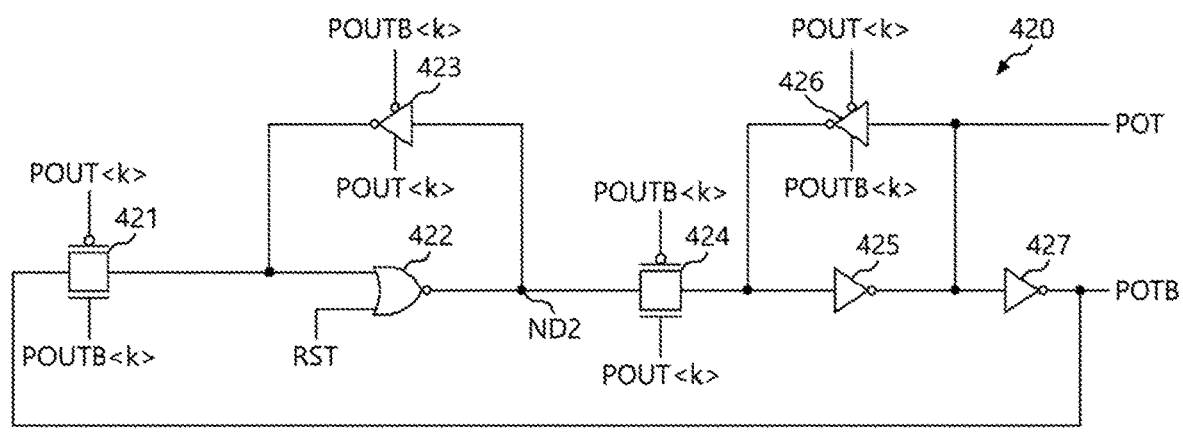
Figure 4:
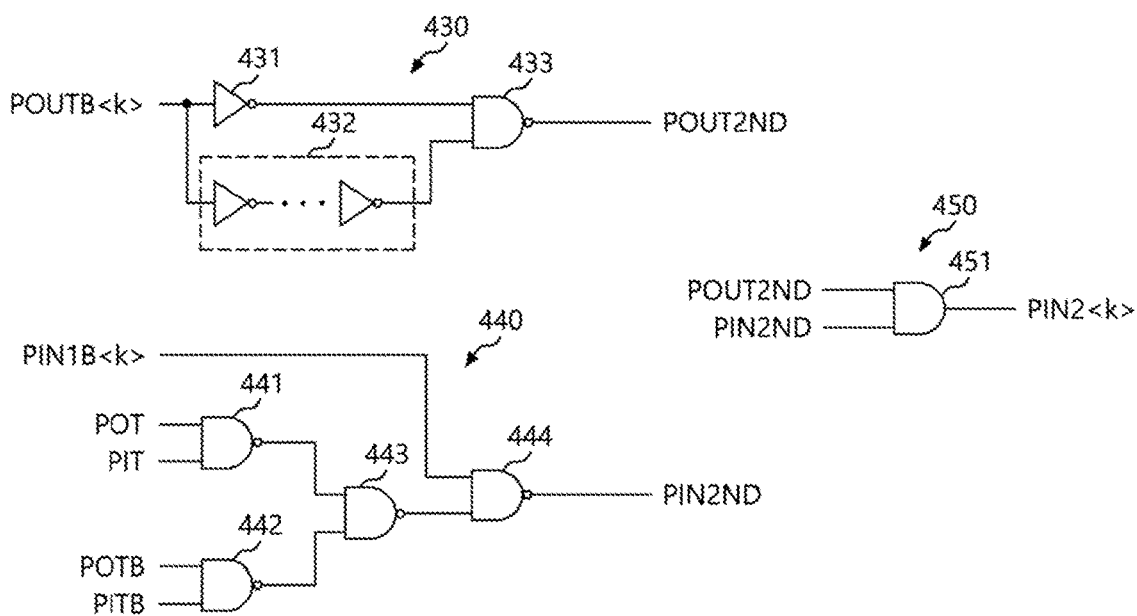

FIG. 4 is a diagram illustrating a representation of an example of a configuration of a second input control signal generation circuit 400 in accordance with an embodiment of the present disclosure. The second input control signal generation circuit 400 may be a part of the second input control signal generation circuit 330 described with reference to FIG. 3. Referring FIG. 4, the second input control signal generation circuit 330 may include a configuration for receiving a k-th first input control signal PIN1<$k$> among the first input control signals PIN1<1:$m$> and a k-th output control signal POUT<k> among the output control signals POUT<1:$m$> and generating a k-th second input control signal PIN2<$k$> among the second input control signals PIN2<1:$m$>. Referring to FIG. 4, the second input control signal generation circuit 400 may include a first level signal generator 410, a second level signal generator 420, a first pulse generator 430, a second pulse generator 440 and a gating circuit 450. The first level signal generator 410 may generate the first level signal PIT and the complementary signal PITB of the first level signal PIT based on the kth first input control signal PIN1<$k$>.

The first level signal generator 410 may change the logic level of the first level signal PIT whenever the kth first input control signal PIN1<$k$> is enabled. The second level signal generator 420 may generate the second level signal POT and the complementary signal POTB of the second level signal POT based on the kth output control signal POUT<k>. The second level signal generator 420 may change the logic level of the second level signal POT whenever the kth output control signal POUT<k> is enabled. The first pulse generator 430 may generate a first pulse signal POUT2ND based on the kth output control signal POUT<k>. The first pulse generator 430 may receive the kth complementary output control signal POUTB<k> of the kth output control signal POUT<k> and may generate the first pulse signal POUT2ND based on the kth complementary output control signal POUTB<k> of the kth output control signal POUT<k>. For example, the first pulse generator 430 may generate the first pulse signal POUT2ND having substantially the same pulse width as the kth first input control signal PIN1<k> based on the kth output control signal POUT<k>. The second pulse generator 440 may generate a second pulse signal PIN2ND based on the first level signal PIT, the second level signal POT and the kth first input control signal PIN1<k>. The second pulse generator 440 may compare the logic levels of the first level signal PIT and the second level signal POT and may provide the kth complementary first input control signal PIN1B<k> of the kth first input control signal PIN1<k> as the second pulse signal PIN2ND according to the comparison result. For example, when both of the first level signal PIT and the second level signal POT have a high level, the second pulse generator 440 may invert the kth complementary first input control signal PIN1B<k> of the kth first input control signal PIN1<k> and may provide the inverted signal as the second pulse signal PIN2ND. That is, the second pulse generator 440 may provide the kth first input control signal PIN1<k> as the second pulse signal PIN2ND. When the logic levels of the first level signal PIT and the second level signal POT are different from each other, the second pulse generator 440 may keep the second pulse signal PIN2ND having a high level regardless of the enablement of the kth first input control signal PIN1<k>. The gating circuit 450 may generate the kth second input control signal PIN2<k> by gating the first pulse signal POUT2ND and the second pulse signal PIN2ND.

Referring to FIG. 4, the first level signal generator 410 may include a first pass gate 411, a first NOR gate 412, a first inverter 413, a second pass gate 414, a second inverter 415, a third inverter 416 and a fourth inverter 417. The first pass gate 411 may receive the complementary signal PITB of the first level signal PIT. The first pass gate 411 may receive the kth first input control signal PIN1<k> at its P-channel node and may receive the kth complementary first input control signal PIN1B<k> of the kth first input control signal PIN1<k> at its N-channel node. The first pass gate 411 may output the complementary signal PITB of the first level signal PIT when the kth first input control signal PIN1<k> is enabled. The first NOR gate 412 may receive the output of the first pass gate 411 at a first input node and may receive a reset signal RST at a second input node. An output node of the first NOR gate 412 may be coupled to a first node ND1. When the reset signal RST is enabled to a high level, the first NOR gate 412 may reset the voltage level of the first node ND1 to a to low level. The reset signal RST may be disabled to a low level after initialization of the voltage level of the first node ND1 and the first NOR gate 412 may change the voltage level of the first node ND1 based on the output of the first pass gate 411. The first inverter 413 may receive the kth first input control signal PIN1<k>. When the first input control signal PIN1<k> is disabled to a high level, the first inverter 413 may invert the voltage level of the first node ND1 and may feed the inverted signal back to the first input node of the first NOR gate 412. Therefore, when the reset signal RST is disabled and the kth first input control signal PIN1<k> is disabled, the first inverter 413 may keep the voltage level of the first node ND1 by forming a latch together with the first NOR gate 412.

The second pass gate 414 may receive the kth first input control signal PIN1<k> and may couple the first node ND1 to the second inverter 415 based on the kth first input control signal PIN1<k>. The second pass gate 414 may receive the kth complementary first input control signal PIN1B<k> of the first input control signal PIN1<k> at its P-channel node and may receive the kth first input control signal PIN1<k> at its N-channel node. When the kth first input control signal PIN1<k> is disabled to a high level, the second pass gate 414 may allow the signal of the first node ND1 to be input to the second inverter 415. The second inverter 415 may output the first level signal PIT by inverting the output of the second pass gate 414. The third inverter 416 may receive the kth first input control signal PIN1<k>. When the kth first input control signal PIN1<k> is enabled to a low level, the third inverter 416 may invert the first level signal PIT and may feed the inverted signal back to the input node of the second inverter 415. Therefore, when the kth first input control signal PIN1<k> is enabled, the third inverter 416 may keep the voltage level of the first level signal PIT by forming a latch together with the second inverter 415. The fourth inverter 417 may invert the first level signal PIT and may provide the complementary signal PITB of the first level signal PIT to the first pass gate 411. When the reset signal RST is enabled to a high level and then disabled, the first level signal generator 410 may initialize the first level signal PIT to a high level. After that, the first level signal generator 410 may change the voltage level of the first level signal PIT to an opposite level whenever the kth first input control signal PIN1<k> is enabled. For example, when the kth first input control signal PIN1<k> is firstly enabled and then disabled, the first level signal PIT may be changed from a high level to a low level. When the kth first input control signal PIN1<k> is secondly enabled and then disabled, the first level signal PIT may be changed from a low level to a high level.

Referring to FIG. 4, the second level signal generator 420 may include a third pass gate 421, a second NOR gate 422, a fifth inverter 423, a fourth pass gate 424, a sixth inverter 425, a seventh inverter 426 and an eighth inverter 427. The third pass gate 421 may receive the complementary signal POTB of the second level signal POT. The third pass gate 421 may receive the kth output control signal POUT<k> at its P-channel node and may receive the kth complementary output control signal POUTB<k> of the output control signal POUT<k> at its N-channel node. The third pass gate 421 may output the complementary signal POTB of the second level signal POT when the kth output control signal POUT<k> is enabled. The second NOR gate 422 may receive the output of the third pass gate 421 at a first input node and may receive the reset signal RST at a second input node. An output node of the second NOR gate 422 may be coupled to a second node ND2. When the reset signal RST is enabled to a high level, the second NOR gate 422 may reset the voltage level of the second node ND2 to a low level. The reset signal RST may be disabled after initialization of the voltage level of the second node ND2 and the second NOR gate 422 may change the voltage level of the second node ND2 based on the output of the third pass gate 421. The fifth inverter 423 may receive the kth output control signal POUT<k>. When the kth output control signal POUT<k> is disabled to a high level, the fifth inverter 423 may invert the voltage level of the second node ND2 and may feed the inverted signal back to the first input node of the second NOR gate 422. Therefore, when the reset signal RST is disabled and the kth output control signal POUT<k> is disabled, the fifth inverter 423 may keep the voltage level of the second node ND2 by forming a latch together with the second NOR gate 422.

The fourth pass gate 424 may receive the kth output control signal POUT<k> and may couple the second node ND2 to the sixth inverter 425 based on the kth output control signal POUT<k>. The fourth pass gate 424 may receive the kth complementary output control signal POUTB<k> of the kth output control signal POUT<k> at its P-channel node and may receive the kth output control signal POUT<k> at its N-channel node. When the kth output control signal POUT<k> is disabled to a high level, the fourth pass gate 424 may allow the signal of the second node ND2 to be input to the sixth inverter 425. The sixth inverter 425 may output the second level signal POT by inverting the output of the fourth pass gate 424. The seventh inverter 426 may receive the kth output control signal POUT<k>. When the kth output control signal POUT<k> is enabled to a low level, the seventh inverter 426 may invert the second level signal POT and may feed the inverted signal back to the input node of the sixth inverter 425. Therefore, when the kth output control signal POUT<k> is enabled, the seventh inverter 426 may keep the voltage level of the second level signal POT by forming a latch together with the sixth inverter 425. The eighth inverter 427 may invert the second level signal POT and may provide the complementary signal POTB of the second level signal POT to the third pass gate 421. When the reset signal RST is enabled to a high level and then disabled, the second level signal generator 420 may initialize the second level signal POT to a high level. After that, the second level signal generator 420 may change the voltage level of the second level signal POT to an opposite level whenever the kth output control signal POUT<k> is enabled. For example, when the kth output control signal POUT<k> is firstly enabled and then disabled, the second level signal POT may be changed from a high level to a low level. When the kth output control signal POUT<k> is secondly enabled and then disabled, the second level signal POT may be changed from a low level to a high level.

Referring to FIG. 4, the first pulse generator 430 may include a ninth inverter 431, an inverter chain 432 and a first NAND gate 433. The ninth inverter 431 may invert the kth complementary output control signal POUTB<k> of the kth output control signal POUT<k>. The inverter chain 432 may include an even number of inverters and may delay the kth complementary output control signal POUTB<k> of the kth output control signal POUT<k> without inversion of the kth complementary output control signal POUTB<k> of the kth output control signal POUT<k>. The first NAND gate 433 may generate the first pulse signal POUT2ND by receiving the outputs of the ninth inverter 431 and the inverter chain 432. The number of inverters included in the inverter chain 432 may be variously changed for the control of the pulse width of the first pulse signal POUT2ND. The second pulse generator 440 may include a second NAND gate 441, a third NAND gate 442, a fourth NAND gate 443 and a fifth NAND gate 444. The second NAND gate 441 may receive the first level signal PIT and the second level signal POT. The third NAND gate 44 may receive the complementary signal PITB of the first level signal PIT and the complementary signal POTB of the second level signal POT. The fourth NAND gate 443 may receive the outputs of the to second and third NAND gates 441 and 442. The fifth NAND gate 444 may receive the output of the fourth NAND gate 443 and the kth complementary first input control signal PIN1B<k> of the kth first input control signal PIN1<k> and may output the second pulse signal PIN2ND. The gating circuit 450 may include an AND gate 451. The AND gate 451 may generate the kth second input control signal PIN2<k> by gating the first pulse signal POUT2ND and the second pulse signal PIN2ND.

Figure 5:
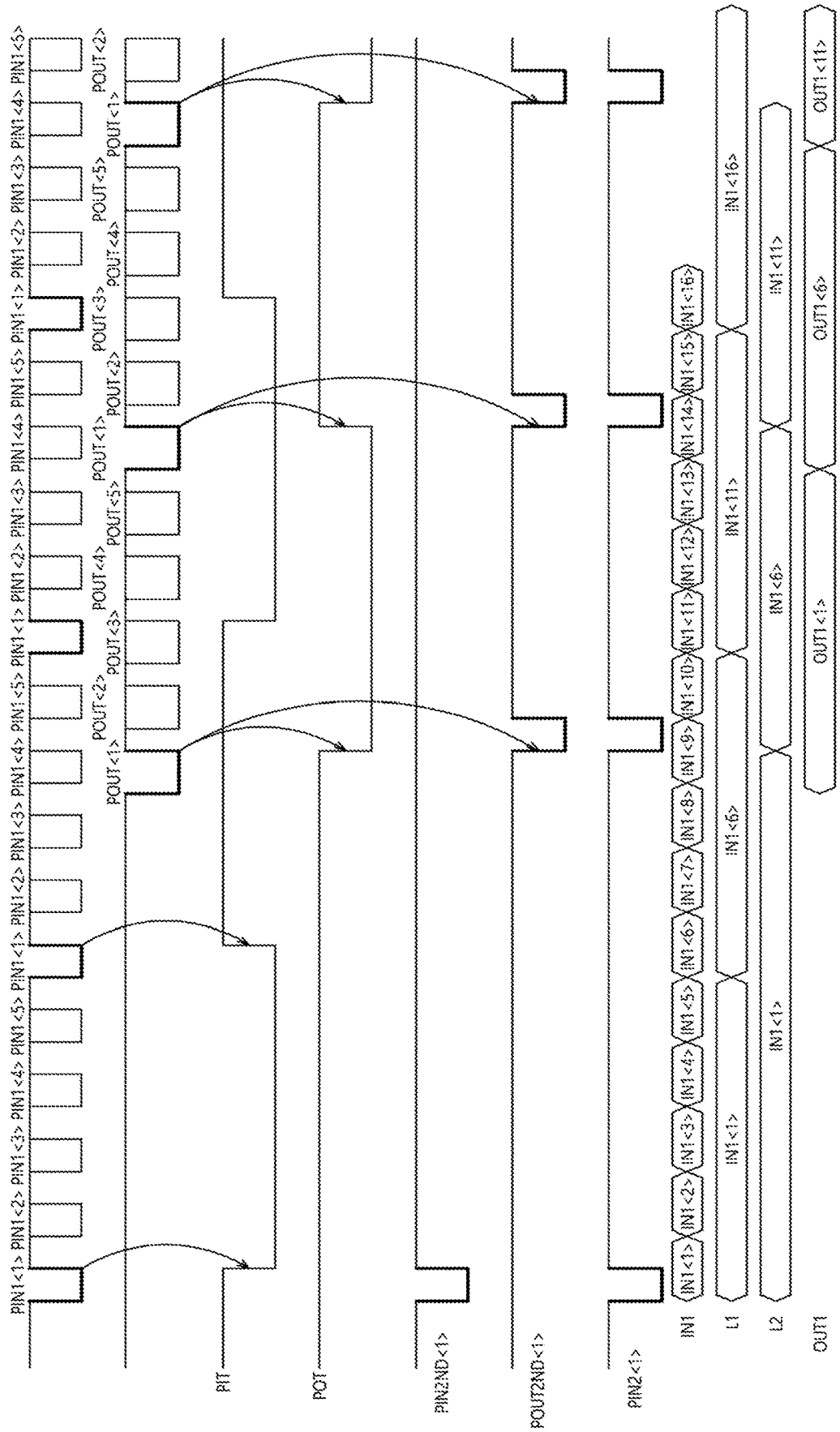
FIGS. 5 and 6 are timing diagrams illustrating a representation of an example of an operation of a semiconductor apparatus in accordance with an embodiment of the present disclosure.
Figure 6:
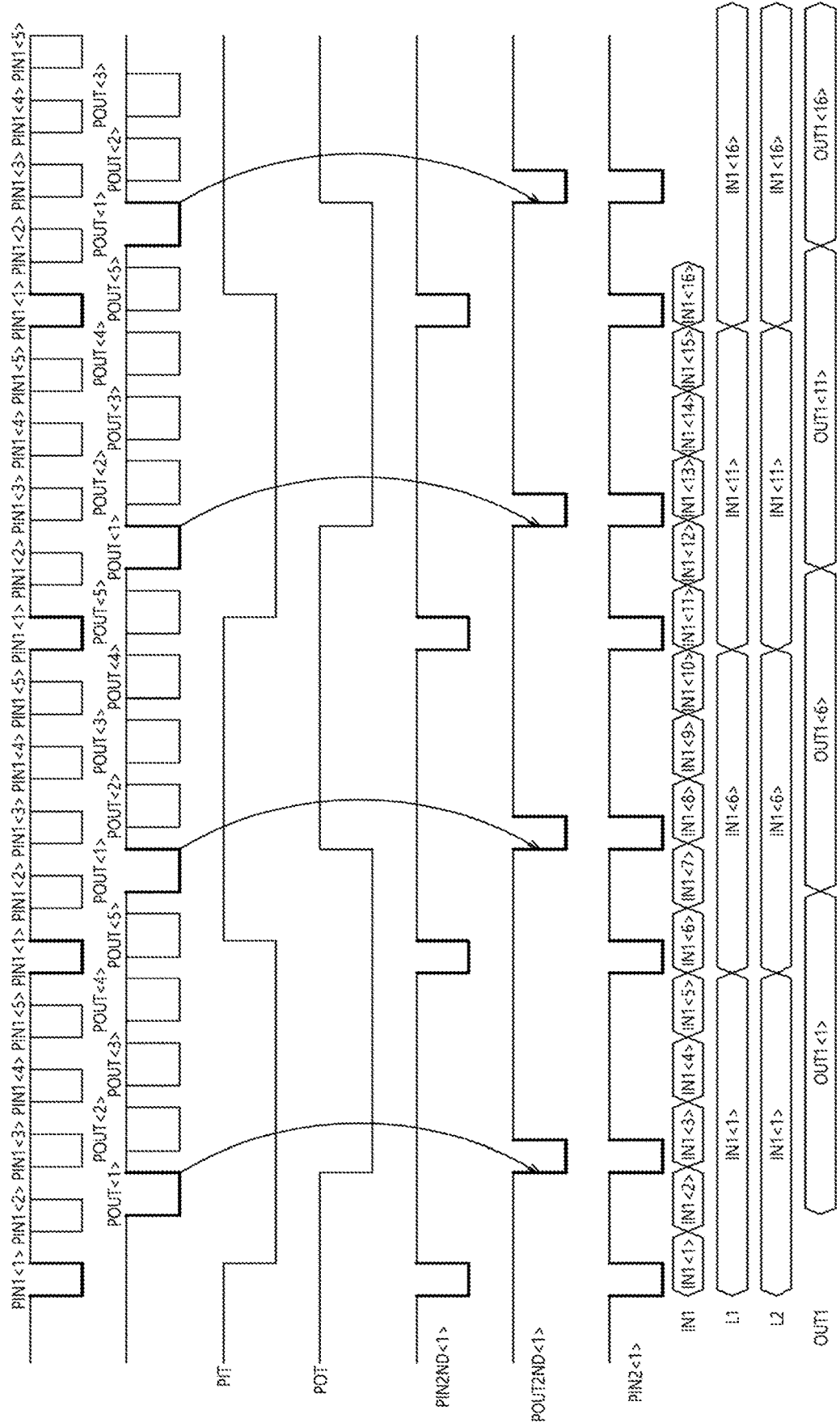

FIGS. 5 and 6 are timing diagrams illustrating a representation of an example of an operation of the semiconductor apparatus 100 in accordance with an embodiment of the present disclosure. Hereinafter, described with reference to FIGS. 1 to 5 will be the operation of the semiconductor apparatus 100 in accordance with an embodiment of the present disclosure. Referring to FIGS. 5 and 6, an operation of the first pipe latch 111 will be representatively described in the first pipe circuit 110 including a pipe latch. The first pipe circuit 110 may include five pipe latches, may receive sixteen numbers of the first input signals IN1<1:16> and may output the first output signals OUT1<1:16>. FIG. 5 illustrates the semiconductor apparatus 100 in the case that the pipe depth is insufficient. The insufficient pipe depth may be the case that the first input signal IN1<1> is secondly enabled (i.e., enabled for a second time within an interval) before the output control signal POUT<1> is enabled and after the first input signal IN1<1> is firstly enabled (i.e., enabled for a first time within an interval). When the reset signal RST is enabled, the first level signal PIT and the second level signal POT may be initialized to a high level. The first input control signal generation circuit 310 may first enable the first input control signal PIN1<1> based on the command signal CMD and the clock signal CLK. The second pulse generator 440 may enable the second pulse signal PIN2ND since both of the first level signal PIT and the second level signal POT have a high level. Therefore, the second input control signal generation circuit 330 may also enable the second input control signal PIN2<1> together with the first input control signal PIN1<1>. The first pipe latch 111 may store the first signal IN1<1> among the first input signals IN1<1:16> into the second latch node L2 as well as the first latch node L1 based on the first input control signal PIN1<1> and the second input control signal PIN2<1>. When the first input control signal PIN1<1> is disabled, the first level signal generator 410 may change the first level signal PIT to a low level. After that, as the first input control signals PIN1<2:5> are sequentially enabled, the second to fifth signals IN1<2>, IN1<3>, IN1<4> and IN1<5> among the first input signals IN1<1:16> may be stored respectively into the second to fifth pipe latches.

The pipe control signal generation circuit 160 may secondly enable (i.e., enabled for a second time within an interval) the first input control signal PIN1<1> in order to the sixth signal IN1<6> among the first input signals IN1<1: 16>. Since the first level signal PIT is a low level, the second input control signal generation circuit 330 might not enable the second input control signal PIN2<1> even when the first input control signal PIN1<1> is secondly enabled (i.e., enabled for a second time within an interval). The first pipe latch 111 may store the sixth signal IN1<6> into the first latch node L1 based on the secondly enabled first input control signal PIN1<1>. The first signal IN1<1> may be still stored in the second latch node L2. When the secondly enabled first input control signal PIN1<1> is disabled, the first level signal generator 410 may change the first level signal PIT to a high level. After that, when the output control signal POUT<1> is enabled, the first pipe latch 111 may output a signal corresponding to the first signal IN1<1> stored in the second latch node L2 as the first output signal OUT1<1>. When the output control signal POUT<1> is disabled, the second level signal generator 420 may change the second level signal POT to a low level. The first pulse generator 430 may generate the first pulse signal POUT2ND based on the output control signal POUT<1> and the second input control signal generation circuit 330 may enable the second input control signal PIN2<1>. When the second input control signal PIN2<1> is enabled, the sixth signal IN1<6> stored in the first latch node L1 may be stored into the second latch node L2. Therefore, the first pipe latch 111 may store the first signal IN1<1> and the sixth signal IN1<6> together and may sequentially output the first output signals OUT1<i> and OUT1<6> corresponding to the first signal IN1<1> and the sixth signal IN1<6>.

After that, since the second level signal POT is a low level, the second input control signal generation circuit 330 might not enable the second input control signal PIN2<1> even when the first input control signal PIN1<1> is thirdly enabled (i.e., enabled for a third time within an interval). The second input control signal generation circuit 330 may enable the second input control signal PIN2<1> whenever the output control signal POUT<1> is enabled. Therefore, the first pipe latch 111 may store the sixth signal IN1<6> in the second latch node L2 and may store the eleventh signal IN1<11> in the first latch node L1. After outputting the first output signal OUT1<6> corresponding to the sixth signal IN1<6>, the first pipe latch 111 may store the eleventh signal IN1<11> into the second latch node L2 and may store the sixteenth signal IN1<16> into the first latch node L1. After that, whenever the output control signal POUT<1> is enabled, the eleventh signal IN1<11> may be output as the first output signal OUT1<11> and then the sixteenth signal IN1<16> may be output also as the first output signal.

FIG. 6 illustrates the operation of the semiconductor apparatus 100 in the case that the pipe depth is enough. The enough pipe depth may be the case that the first input signal IN1<1> is secondly enabled (i.e., enabled for a second time within an interval) after the first input signal IN1<1> is firstly enabled (i.e., enabled for a first time within an interval) and the output control signal POUT<1> is enabled. When the reset signal RST is enabled, the first level signal PIT and the second level signal POT may be initialized to a high level. The first input control signal generation circuit 310 may first enable the first input control signal PIN1<1> based on the command signal CMD and the clock signal CLK. The second pulse generator 440 may enable the second pulse signal PIN2ND since both of the first level signal PIT and the second level signal POT have a high level. Therefore, the second input control signal generation circuit 330 may also enable the second input control signal PIN2<1> together with the first input control signal PIN1<1>. The first pipe latch 111 may store the first signal IN1<1> among the first input signals IN1<1:16> into the second latch node L2 as well as the first latch node L1 based on the first input control signal PIN1<1> and the second input control signal PIN2<1>. When the first input control signal PIN1<1> is disabled, the first level signal generator 410 may change the first level signal PIT to a low level.

When the output control signal POUT<1> is enabled, the first pipe latch 111 may output the first signal IN1<1> stored in the second latch node L2 as the first output signal OUT1<1>. When the output control signal POUT<1> is disabled, the second level signal generator 420 may change the second level signal POT to a low level. The first pulse generator 430 may generate the first pulse signal POUT2ND based on the output control signal POUT<1> and the second input control signal generation circuit 330 may enable the second input control signal PIN2<1>, Even when the second input control signal PIN2<1> is enabled, the first pipe latch 111 may keep the voltage levels of the first latch node L1 and the second latch node L2.

When the first input control signal PIN1<1> is secondly enabled (i.e., enabled for a second time within an interval), the second pulse generator 440 may generate the second pulse signal PIN2ND and the second input control signal generation circuit 330 may enable the second input control signal PIN2<1> together with the first input control signal PIN1<1>, since both of the first level signal PIT and the second level signal POT have a low level. Therefore, the first pipe latch 111 may store the sixth signal IN1<6> among the first input signals IN1<1:16> into both of the first latch node L1 and the second latch node L2. When the secondly enabled first input control signal PIN1<1> is disabled, the first level signal generator 410 may change the first level signal PIT to a high level. When the output control signal POUT<1> is enabled, the first pipe latch 111 may output the sixth signal IN1<6> stored in the second latch node L2 as the first output signal OUT1<6>. When the output control signal POUT<1> is disabled, the second level signal generator 420 may change the second level signal POT to a high level. The first pulse generator 430 may generate the first pulse signal POUT2ND based on the output control signal POUT<1> and the second input control signal generation circuit 330 may enable the second input control signal PIN2<1>. Even when the second input control signal PIN2<1> is enabled, the first pipe latch 111 may keep the voltage levels of the first latch node L1 and the second latch node L2.

When the first input control signal PIN1<1> is thirdly enabled (i.e., enabled for a third time within an interval), the second input control signal PIN2<1> may also enabled together with the first input control signal PIN1<1> and the first pipe latch 111 may store the eleventh signal IN1<11> among the first input signals IN1<1:16> into both of the first latch node L1 and the second latch node L2. When the output control signal POUT<1> is enabled, the first pipe latch 111 may output the eleventh signal IN1<11> stored in the second latch node L2 as the first output signal OUT1<11>. When the first input control signal PIN1<1> is fourthly enabled (i.e., enabled for a fourth time within an interval), the second input control signal PIN2<1> may also enabled together with the first input control signal PIN1<1> and the first pipe latch 111 may store the sixteenth signal IN1<16> among the first input signals IN1<1:16> into both of the first latch node L1 and the second latch node L2. When the output control signal POUT<1> is enabled, the first pipe latch 111 may output the sixteenth signal IN1<16> stored in the second latch node L2 as the first output signal OUT1<16>. Differently from the embodiments described with reference to FIGS. 5 and 6, even when the first input control signal PIN1<1> or the output control signal POUT<1> is generated at overlapped timing point with each other, the first pipe latch 111 might not store into the second latch node L2 a signal stored in the first latch node L1 until a signal stored in the second latch node L2 is output. As described above, the pipe latch in accordance with an embodiment of the present disclosure may store at least two signals together and may sequentially output the signals, and therefore the pipe latch having less numbers of pipe circuits may sequentially store and output a great number of signals.

While certain embodiments have been described above, it will be understood to those skilled in the art that the embodiments described are by way of example only. Accordingly, the pipe latch, semiconductor apparatus and semiconductor system using the same should not be limited based on the described embodiments. Rather, the pipe latch, semiconductor apparatus and semiconductor system using the same described herein should only be limited in light of the claims that follow when taken in conjunction with the above description and accompanying drawings.

What is claimed is:
1. A semiconductor apparatus comprising:
a pipe latch, the pipe latch comprising:
a first latch unit configured to store an input signal into a first latch node based on a first input control signal;

a second latch unit configured to store the signal stored in the first latch node into a second latch node based on a second input control signal; and an output unit configured to output the signal stored in the second latch node as an output signal based on an output control signal.

2. The semiconductor apparatus of claim 1, wherein the second input control signal is generated on the basis of the first input control signal and the output control signal.

3. The semiconductor apparatus of claim 2,
wherein the second input control signal is enabled on the basis of the first input control signal when the first input control signal is enabled for a first time within an interval, and
wherein the first latch unit and the second latch unit store a first signal of the input signal into both of the first latch node and the second latch node.

4. The semiconductor apparatus of claim 3, wherein the first latch node stores, when the first input control signal is enabled for a second time within the interval, a second signal of the input signals into the first latch node.

5. The semiconductor apparatus of claim 4,
wherein when the output unit outputs the signal stored in the second latch node as the output signal based on the output control signal, the second input control signal is enabled, and
the second latch unit stores the signal stored in the first latch node into the second latch node.

6. The semiconductor apparatus of claim 4, wherein the second input control signal is not enabled until the output control signal is enabled even when the first input control signal is enabled.

7. The semiconductor apparatus of claim 1, further comprising:
a pipe control signal generation circuit configured to generate the first input control signal and the output control signal based on a command signal and a clock signal, and configured to generate the second input control signal based on the first input control signal and the output control signal.

8. A semiconductor apparatus comprising:
a pipe control signal generation circuit configured to generate a first input control signal and an output control signal based on a command signal and a clock signal, and configured to generate a second input control signal based on the first input control signal and the output control signal; and
a pipe circuit including at least two pipe latches configured to store input signals to output output signals based on the first input control signal, the second input control signal and the output control signal, and configured to store at least two input signals.

9. The semiconductor apparatus of claim 8, wherein the pipe control signal generation circuit comprises:
a first input control signal generation circuit configured to generate the first input control signal based on the command signal and the clock signal;
an output control signal generation circuit configured to generate the output control signal based on the command signal and the clock signal; and
a second input control signal generation circuit configured to generate the second input control signal based on the first input control signal and the output control signal.

10. The semiconductor apparatus of claim 9, wherein the second input control signal generation circuit changes a logic level of a first level signal whenever the first input control signal is enabled, changes a logic level of a second level signal whenever the output control signal is enabled, and enables the second input control signal based on either of the first input control signal or the output control signal when the logic levels of the first level signal and the second level signal are the same as each other.

11. The semiconductor apparatus of claim 9, wherein the second input control signal generation circuit comprises:
a first level signal generator configured to generate a first level signal based on the first input control signal and configured to change a logic level of the first level signal whenever the first input control signal is enabled;
a second level signal generator configured to generate a second level signal based on the output control signal and configured to change a logic level of the second level signal whenever the output control signal is enabled;
a first pulse generator configured to generate a first pulse signal from the output control signal;
a second pulse generator configured to generate a second pulse signal based on the first level signal, the second level signal and the first input control signal; and
a gating circuit configured to generate the second input control signal by gating the first pulse signal and the second pulse signal.

12. The semiconductor apparatus of claim 8, wherein the pipe circuit comprises:
a first pipe latch configured to store an input signal of an assigned turn and sequentially output the stored signals as the output signals based on an assigned first input control signal, an assigned second input control signal and an assigned output control signal; and
a second pipe latch configured to store an input signal of an assigned turn and sequentially output the stored signals as the output signals based on an assigned first input control signal, an assigned second input control signal and an assigned output control signal.

13. The semiconductor apparatus of claim 12, wherein the first pipe latch comprises:
a first latch unit configured to store the input signal of the assigned turn into a first latch node based on the assigned first input control signal;
a second latch unit configured to store the signal stored in the first latch node into a second latch node based on the assigned second input control signal; and
an output node configured to output the signal stored in the second latch node as the output signal based on the assigned output control signal.

14. The semiconductor apparatus of claim 12, wherein the second pipe latch comprises:
a first latch unit configured to store the input signal of the assigned turn into a first latch node based on the assigned first input control signal;
a second latch unit configured to store the signal stored in the first latch node into a second latch node based on the assigned second input control signal; and
an output node configured to output the signal stored in the second latch node as the output signal based on the assigned output control signal.

15. A semiconductor apparatus comprising first to m-th pipe latches configured to sequentially store a signal of an assigned turn among n numbers of input signals and generate output signals, wherein n is an integer equal to or greater than 3 and m is an integer between 2 and n,
wherein the first pipe latch receives and stores a first signal of the input signals; stores, when an (m+1)th signal of the input signals is input before the first signal is output as the output signal, the first signal and the (m+1)th signal together; and sequentially outputs the first signal and the (m+1)th signal.

16. The semiconductor apparatus of claim 15, wherein the first pipe latch comprises:
a first latch unit configured to store the assigned signal into a first latch node when a first input control signal is enabled;
a second latch unit configured to store the signal stored in the first latch node into a second latch node when a second input control signal is enabled; and
an output unit configured to output the signal stored in the second latch node as the output signal when an output control signal is enabled.

17. The semiconductor apparatus of claim 16, further comprising a pipe control signal generation circuit configured to generate the first input control signal, the second input control signal and the output control signal.

18. The semiconductor apparatus of claim 17, wherein the pipe control signal generation circuit enables, when the first input control signal is enabled for a first time within an interval, the second input control signal together with the firstly enabled input control signal.

19. The semiconductor apparatus of claim 17, wherein the pipe control signal generation circuit prevents the second input control signal from being enabled until the output control signal is enabled even when the first input control signal is enabled for a second time within an interval.

* * * * *